United States Patent
Veitschegger

(10) Patent No.: US 10,672,688 B2
(45) Date of Patent: Jun. 2, 2020

(54) SEMICONDUCTOR POWER DEVICE INCLUDING RING FRAME FOR THERMAL IMPEDANCE REDUCTION

(71) Applicant: Integra Technologies, Inc., El Segundo, CA (US)

(72) Inventor: William Veitschegger, Folsom, CA (US)

(73) Assignee: Integra Technologies, Inc., El Segundo, CA (US)

(*) Notice: Subject to any disclaimer, the term of this patent is extended or adjusted under 35 U.S.C. 154(b) by 0 days.

(21) Appl. No.: 15/984,271

(22) Filed: May 18, 2018

(65) Prior Publication Data
US 2019/0355648 A1 Nov. 21, 2019

(51) Int. Cl.
| | |
|---|---|
| H01L 23/495 | (2006.01) |
| H01L 23/40 | (2006.01) |
| H01L 23/492 | (2006.01) |
| H01L 29/778 | (2006.01) |
| H01L 23/64 | (2006.01) |
| H01L 23/58 | (2006.01) |
| H01L 23/367 | (2006.01) |
| H01L 23/498 | (2006.01) |

(52) U.S. Cl.
CPC ........ *H01L 23/4952* (2013.01); *H01L 23/367* (2013.01); *H01L 23/40* (2013.01); *H01L 23/492* (2013.01); *H01L 23/585* (2013.01); *H01L 23/64* (2013.01); *H01L 29/778* (2013.01); *H01L 23/49506* (2013.01); *H01L 23/49861* (2013.01)

(58) Field of Classification Search
CPC . H01L 23/4952; H01L 23/492; H01L 23/367; H01L 23/585; H01L 23/40; H01L 23/64; H01L 23/49506; H01L 23/49861; H01L 29/778
See application file for complete search history.

(56) References Cited

U.S. PATENT DOCUMENTS

| | | | |
|---|---|---|---|
| 5,506,446 A * | 4/1996 | Hoffman | H01L 23/057 257/668 |
| 10,141,238 B1 * | 11/2018 | Veitschegger | H01L 24/49 |
| 2016/0268190 A1 | 9/2016 | Mcknight-Macneil et al. | |

* cited by examiner

*Primary Examiner* — Laura M Menz
*Assistant Examiner* — Candice Chan
(74) *Attorney, Agent, or Firm* — George Fountain; Loza & Loza LLP

(57) ABSTRACT

A semiconductor power device including a base plate, a ring frame disposed over the base plate, a semiconductor power die disposed on the base plate and surrounded by the ring frame, an input lead by way the semiconductor power die receives an input signal, wherein the input lead is disposed over a first portion of the ring frame, and an output lead by way an output signal generated by the semiconductor power die is sent to another device, wherein the output lead is disposed over a second portion of the ring frame. The ring frame may be comprised of a relatively high thermal conductivity material, such as beryllium-oxide (Be), silicon-carbide (SiC), diamond, aluminum nitride (AlN), or others. The ring frame produces at least one more heat path between the active region of the semiconductor power die and the base plate so as to reduce the effective thermal impedance.

20 Claims, 5 Drawing Sheets

SEMICONDUCTOR POWER DEVICE INCLUDING RING FRAME FOR THERMAL IMPEDANCE REDUCTION

FIELD

Aspects of the present disclosure relate generally to semiconductor power devices, and more particularly, to a semiconductor power device including a high thermal-conductive ring frame situated around and thermally-coupled to the power device for reducing the thermal impedance between an active region of the power device and thermal ground (e.g., a heat sink base plate).

BACKGROUND

A semiconductor power device usually generates substantial amount of heat at and near its active region. Usually, a maximum temperature, often referred to as the maximum junction temperature, is specified at which the temperature of the active region should not exceed so that the semiconductor power device may be operated in a safe and reliable manner.

Generally, the semiconductor material used in the semiconductor power device are optimized for processing signals at high frequencies, such as radio frequency (RF), microwave, and millimeter wave, but not necessarily optimized to remove heat from the active region of the semiconductor power device. Accordingly, the effective thermal impedance through such semiconductor material is generally undesirably high.

Thus, there is a need to decrease the effective thermal impedance to reduce the temperature of the active region or allow the semiconductor power device to operate at higher power configurations.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to a semiconductor power device including a base plate; a ring frame disposed on the base plate; an input lead disposed on the ring frame; an output lead disposed on the ring frame; and a semiconductor power die disposed on the base plate and surrounded by the ring frame, wherein the semiconductor power die is configured to receive an input signal from the input lead and generate an output signal at the output lead. The ring frame may be comprised of relatively high-thermal conductive material such as a beryllium oxide (BeO) material, a silicon carbide (SiC) material, diamond, or aluminum nitride (AlN), for removing heat from the semiconductor power die.

Another aspect of the disclosure relates to a semiconductor power device including a base plate; at least one frame disposed over the base plate; an input lead disposed over the at least one frame; an output lead disposed over the at least one frame; and a semiconductor power die disposed over the base plate, wherein the semiconductor power die is configured to receive an input signal from the input lead and generate an output signal at the output lead. The at least one frame need not be ring-shaped, and may include more than one frame, such as an input frame for supporting the input lead and an output frame for supporting an output lead. Similarly, the at least one frame may be comprised of relatively high-thermal conductive material as discussed.

Another aspect of the disclosure relates to a gallium-nitride (GaN) on silicon carbide (SiC) high electron mobility transistor (HEMT) including a base plate; at least one frame disposed over the base plate; an input lead disposed over the at least one frame; an output lead disposed over the at least one frame; a semiconductor power die disposed over the base plate, wherein the semiconductor power die includes a set of one or more gate electrodes configured to receive an input signal by way of the input lead, a set of one or more source electrodes electrically coupled to the base plate, and a set of one or more drain electrodes configured to produce an output signal at the output lead; a first set of one or more electrical conductors by way the set of one or more gate electrodes receive the input signal from the input lead; a second set of one or more electrical conductors electrically connecting the set of one or more source electrodes to the base plate; and a third set of one or more electrical conductors by way the set of one or more drain electrodes produce the output signal at the output lead.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

This disclosure describes a new method for reducing the thermal impedance associated with a semiconductor high power chip or die. The method entails conducting heat from a top surface or active region of the die via a ring frame surrounding and thermally coupled the die. The specific application described herein is for a high power radio frequency (RF) Gallium-Nitride (GaN) on Silicon-Carbide (SiC) die. However, this method could be applied to any high power die technology being used at any frequency from direct current (DC) to millimeter wave.

High power RF transistors have a maximum junction operating temperature for reliable operation. The junction temperature is determined by the power dissipation times the thermal impedance. In typical applications, the thermal impedance is determined by the heat flow from the device junction or active region near the top surface of the die down through the die substrate material. Usually, the thermal conductivity of the substrate material is not very good, and may degrade as the die temperature increases.

The use of GaN on SiC to fabricate High Electron Mobility Transistors (HEMTs) enables much higher power densities than previous transistor technologies. The higher power densities also generate more heat in a smaller area due to internal dissipation. The smaller area of dissipation reduces the cross sectional area of the heat dissipation path, which increases the junction temperatures. The following describes various techniques to reduce the thermal impedance between a power device and thermal ground to reduce the junction temperature and allow the device to be operated within safe and reliable temperature margins.

Figure 1A:
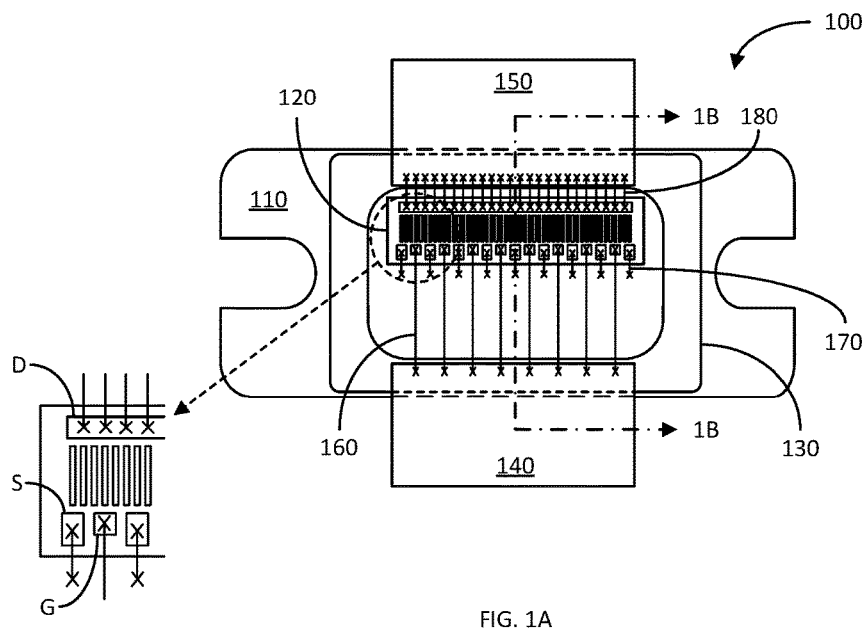
FIGS. 1A-1B illustrate top and cross-sectional views of an exemplary semiconductor power device in accordance with an aspect of the disclosure.

FIG. 1A illustrates a top view of an exemplary semiconductor power device 100 in accordance with an aspect of the disclosure. The semiconductor power device 100 includes a base plate 110 (e.g., a flange), a power semiconductor die 120 disposed on the base plate 110, a ring frame 130 disposed on the base plate 110 and surrounding the power semiconductor die 120, an input lead 140 disposed on an input-side portion of the ring frame 130, and an output lead 150 disposed on an output-side portion of the ring frame 130. In this example, the semiconductor power die 120 is configured as a field effect transistor (FET) type device, such as a GaN on SiC HEMT, but other types of semiconductor devices are applicable to the concepts described herein.

Although not shown, the semiconductor power device 100 may include an electrically-insulating cover mounted on the ring frame 130 and/or the base plate 110 so as to enclose the semiconductor power die 120 and portions of the input and output leads 140 and 150. Further, the illustration shown in FIG. 1A (and FIG. 1B discussed below) may not be to scale. For example, the semiconductor power die 120 may be much smaller compared to the base plate, but is shown larger herein for description purposes. Additionally, depending on the output signal power requirement for the semiconductor power device 100, a plurality of semiconductor power dies 120 may be coupled in parallel between the input and output leads 140 and 150.

Figure 1B:
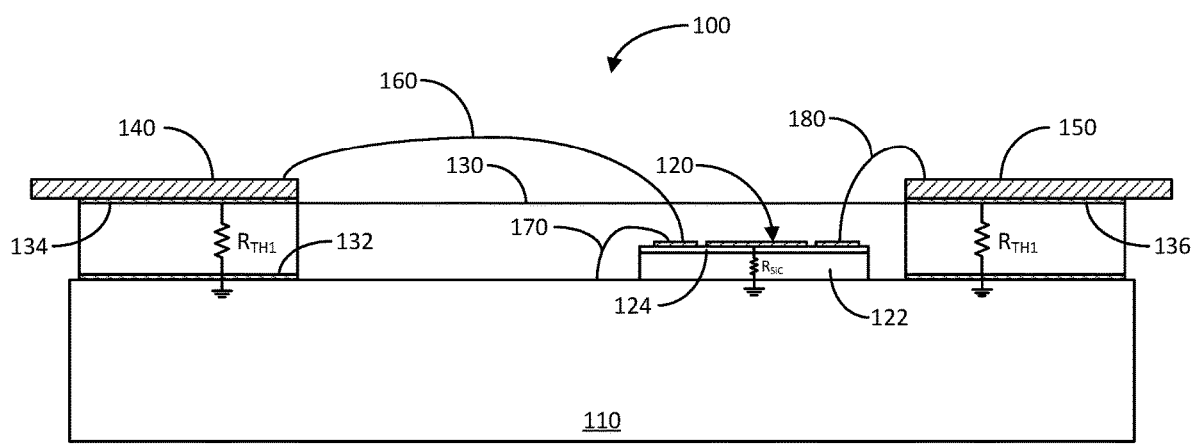

With further reference to FIG. 1B, which illustrates a cross-sectional view of the semiconductor power device 100 along line 1B-1B of FIG. 1A, the semiconductor power die 120 includes a SiC substrate 122 disposed on the base plate 110, and a GaN layer 124 disposed on the SiC substrate 122. As viewed from the top (and better depicted in the blow-up view shown in FIG. 1A), the top surface of the semiconductor power die 120 includes a set of gate electrodes (G), a set of source electrodes (S), and a drain electrode (D) disposed on the GaN layer 124.

The semiconductor power device 100 further includes a set of wirebonds or conductive-ribbons (generally, electrical conductors) 160 electrically coupling the input lead 140 to the set of gate electrodes (G) of the semiconductor power die 120. It shall be understood that there may be other components (e.g., resistor, capacitor, and/or inductor) coupled between the input lead 140 and the set of gate electrodes (G) of the semiconductor die 120, between the input lead 140 and the base plate 110, and/or the set of gate electrodes (G) and the base plate 110. Such components may be used to configure the semiconductor power device 100 with desirable characteristics, such as to improve the impedance match between the input of the semiconductor power device 100 and an input transmission line (not shown) coupled to the input lead 140.

Additionally, the semiconductor power device 100 includes another set of wirebonds or conductive-ribbons (generally electrical conductors) 170 electrically coupling the set of source electrodes (S) of the semiconductor power die 120 to the base plate 110 for electrical grounding purposes.

Also, the semiconductor power device 100 includes yet another set of wirebonds or conductive-ribbons (generally, electrical conductors) 180 electrically coupling the drain electrode (D) of the semiconductor power die 120 to the output lead 150. Similarly, it shall be understood that there may be other components (e.g., resistor, capacitor, and/or inductor) coupled between the drain electrode (D) of the semiconductor die 120 and the output lead 150, the drain electrode (D) and the base plate 110, and/or the base plate 110 and the output lead 150. Such components may be used to configure the semiconductor power device 100 with desirable characteristics, such as to improve the impedance match between the output of the semiconductor power device 100 and an output transmission line (not shown) coupled to the output lead 150.

As better illustrated in FIG. 1B, the relative thickness (although may not be to scale) between the GaN layer 124, the SiC substrate 122, and base plate 110 are shown. As an example, the GaN layer 124 may have a thickness of approximately one (1) micrometer (µm), the SiC substrate 122 may have a thickness of approximately 75 µm, and the base plate 110 may have a thickness of approximately 1000 µm. The base plate 110 may be made out of a high thermal and electrical conductivity material, such as a copper alloy.

During operation, the top surface or active region (e.g., FET channel) of the GaN layer 124 may be operating at temperatures around 200° C., while the base plate 110 may be operating at temperatures around 60° C. At 200° C., both the GaN layer 124 and the SiC substrate 122 have relatively poor thermal conductivity (e.g., 140 and 180 W/m-K, respectively). Because the GaN layer 124 is very thin compared to the SiC substrate 122, the main contributor to the thermal impedance between the top surface or active region of the GaN layer 124 and the base plate 110 (which, because of its high thermal conductivity, substantially acts as thermal ground) is the SiC substrate 122. Thus, as illustrated in FIG. 1B, the effective thermal impedance between the top surface of the GaN layer 124 and the base plate 110 is the thermal impedance $R_{SiC}$ of the SiC substrate 122.

As the thermal impedance $R_{SiC}$ of the SiC substrate 122 is relatively poor at high temperatures (e.g., around 200° C.), the addition of the ring frame 130 thermally coupled to the active region of the semiconductor power die 120 lowers the effective thermal impedance between the active region and the base plate 110 at substantially thermal ground. The ring frame 130 may be made out of a relatively high thermal-conductive, electrically-insulating material, such as Beryllium-Oxide (BeO) (285 W/m-K), Silicon-Carbide (SiC) (374 W/m-K @25° C.), diamond (1800 W/m-K), aluminum-nitride (AlN) (170 W/m-K), or others.

As these materials have a thermal-conductivity higher than the SiC substrate 122 (especially around an operating temperature of 200° C.), the effective thermal impedance between the active region of the semiconductor power die 120 and the base plate 110 at substantially thermal ground is substantially dictated by the thermal impedance $R_{TH1}$ of the ring frame 130. In other words, the effective thermal impedance Reff between the semiconductor power die 120 and the base plate 110 may be approximated by the following equation:

$$Reff = \frac{R_{TH1} \cdot R_{SiC}}{R_{TH1} + R_{SiC}} \approx R_{TH1} \text{ if } R_{TH1} \ll R_{SiC} \qquad \text{Eq. 1}$$

Thus, the ring frame 130 may be configured to substantially reduce the effective thermal impedance Reff between the active region of the semiconductor power die 120 and the base plate 110 and substantially reduce the junction temperature to allow the die to operate within a safer and reliable temperature range.

As illustrated in FIG. 1B, the ring frame 130 may include a thin metallization layer 132 along its bottom for attachment to the base plate 110. Similarly, the ring frame 130 may include another thin metallization layer 134 along its input-side top region for attachment to the input lead 140. In a like manner, the ring frame 130 may include yet another thin metallization layer 136 along its output-side top region for attachment to the output lead 150.

The semiconductor power die 120 receives an input signal from the input lead 140 via the set of electrical conductors 160. The semiconductor power die 120 performs some signal processing on (e.g., amplifying) the input signal to generate an output signal. The output signal is then routed to the output lead via the set of electrical conductors 180.

Figure 2A:
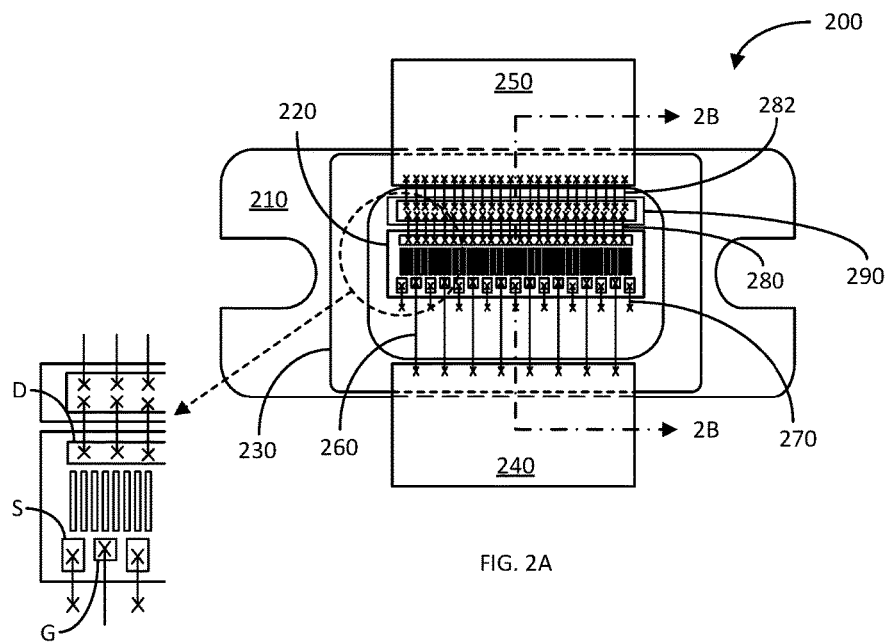
FIGS. 2A-2B illustrate top and cross-sectional views of another exemplary semiconductor power device in accordance with another aspect of the disclosure.

FIG. 2A illustrates a top view of another exemplary semiconductor power device 200 in accordance with another aspect of the disclosure. In summary, the semiconductor power device 200 is similar to that of semiconductor power device 100, but further includes an electrically-insulating thermal substrate situated adjacent to the semiconductor power die. A first set of wirebonds or conductive-ribbons (generally electrical conductors) electrically attach the drain electrode (D) of the semiconductor power die to a top metallization layer on the thermal substrate. A second set of wirebonds or conductive-ribbons (generally electrical conductors) electrically attach the top metallization layer of the thermal substrate to the output lead disposed on a ring frame.

Both the thermal substrate and the ring frame may be made out of a high thermal conductivity material, such as beryllium-oxide (BeO) (285 W/m-K), SiC (374 W/m-K @25° C.), diamond (1800 W/m-K), AlN (170 W/m-K) or others. The thermal impedance (e.g., $R_{Th2}$) of the thermal substrate is in parallel with the thermal impedance of the ring frame (e.g., $R_{TH1}$) and the thermal impedance (e.g., $R_{SiC}$) of the die substrate to reduce the effective thermal impedance $R_{eff}$ between the top surface or active region of the semiconductor power die and the base plate at substantially thermal ground.

In particular, the semiconductor power device 200 includes a base plate 210 (e.g., a flange), a semiconductor power die 220 disposed on the base plate 210, a ring frame 230 disposed on the base plate 210 and surrounding the power semiconductor die 220, an input lead 240 disposed on an input-side portion of the ring frame 230, and an output lead 250 disposed on an output-side portion of the ring frame 230. Again, in this example, the semiconductor power die 220 is configured as a GaN on SiC HEMT, but may be configured as another type of semiconductor device. As illustrated in the accompanying blow up view, the semiconductor power die 220 includes a set of gate electrodes (G), a set of source electrodes (S), and a drain electrode (D).

The semiconductor power device 200 further includes a thermal substrate 290 disposed on the base plate 210 between the semiconductor power die 220 and the output-side portion of the ring frame 230. The thermal substrate 290 includes a top metallization layer, which may be a continuous metallization pad as illustrated or a set of metallization pads (such as one pad for each wirebond attachment). As mentioned, the thermal substrate 290 may be comprised of BeO, SiC, diamond, AlN, or other suitable thermally-conductive and electrically-insulating material.

The semiconductor power device 200 further includes a set of wirebonds or conductive-ribbons (generally, electrical conductors) 260 electrically coupling the input lead 240 to the set of gate electrodes (G) of the semiconductor power die 220, respectively. The semiconductor power die 220 receives an input signal from the input lead 240 via the set of electrical conductors 260. It shall be understood that there may be other components (e.g., resistor, capacitor, and/or inductor) coupled between the input lead 240 and the set of gate electrodes (G) of the semiconductor die 220, between the input lead 240 and the base plate 210, and/or the set of gate electrodes (G) and the base plate 210. Such components may be used to configure the semiconductor power device 200 with desirable characteristics, such as to improve the impedance match between the input of the semiconductor power device 200 and an input transmission line (not shown) coupled to the input lead 240.

Additionally, the semiconductor power device 200 includes another set of wirebonds or conductive-ribbons (generally, electrical conductors) 270 electrically coupling the set of source electrodes (S) of the semiconductor power die 220 to the base plate 210 for electrical grounding purpose.

Also, the semiconductor power device 200 includes a set of wirebonds or conductive-ribbons (generally, electrical conductors) 280 electrically coupling the drain electrode (D) of the semiconductor power die 220 to the top metallization of the thermal substrate 290, and another set of wirebonds or conductive-ribbons (generally, electrical conductors) 282 electrically coupling the top metallization layer of the thermal substrate 290 to the output lead 250. The semiconductor power die 220 produces an output signal (based on the input signal (e.g., by amplifying the input signal)) at the output lead 250 via the set of electrical conductors 280 and 282.

It shall be understood that there may be other components (e.g., resistor, capacitor, and/or inductor) coupled between the drain electrode (D) of the semiconductor die 220 and the output lead 250, between the drain electrode (D) and the base plate 210, and/or between the base plate 210 and the output lead 250. Such components may be used to configure the semiconductor power device 200 with desirable characteristics, such as to improve the impedance match between the output of the semiconductor power device 200 and an output transmission line (not shown) coupled to the output lead 250.

To reduce the thermal impedance between the top surface or active region of the semiconductor power die 220 and the base plate 210 at effectively thermal ground, the thickness and type of metallization layer of the thermal substrate 290 should be selected to improve the thermal heat transfer. For example, the metallization layer of the thermal substrate 290 may be comprised of copper. Additionally, the number of wirebonds 280 and 282 electrically coupling the set of drain electrodes (D) to the metallization layer of the thermal substrate 290, and the metallization layer to the output lead 250, should be as high as possible considering space restriction so as to maximize the bond cross-sectional area. For example, the minimum spacing between round wirebonds is about 0.004 inch. The number of gold wirebonds is made large as possible to conduct heat from the die to the thermal substrate 290 and the ring frame 230. There may be multiple wirebonds per pad if the metallization layer of the thermal substrate comprises a plurality of separate metallization pads.

Figure 2B:
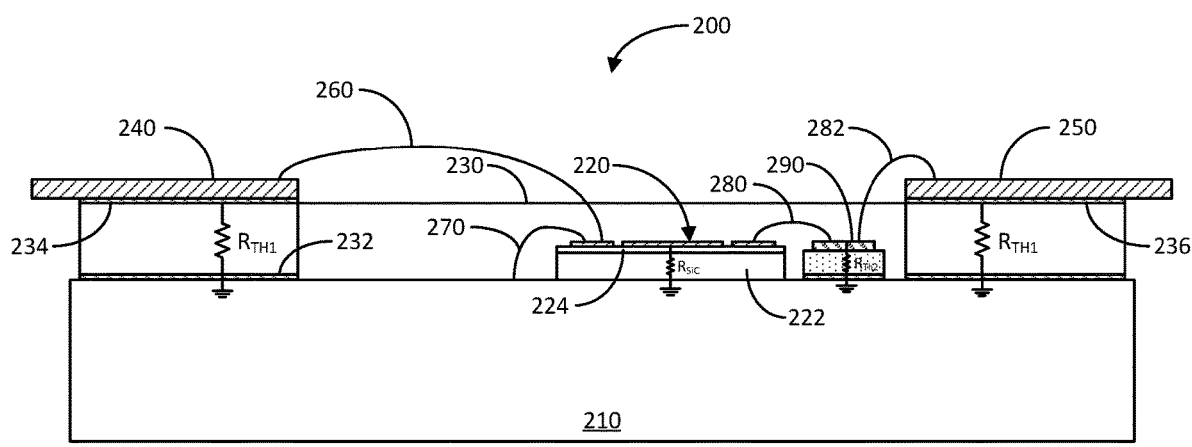

FIG. 2B illustrates a cross-sectional view of the semiconductor power device 200 along line 2B-2B as depicted in FIG. 2A. As illustrated, the semiconductor power device 200 includes the set of wirebonds 260 electrically connecting the input lead 240 to the set of gate electrodes (G) of the semiconductor power die 220. The semiconductor power device 200 also includes the set of wirebonds 270 electrically connecting the set of source electrodes (S) of the semiconductor power die 220 to the base plate 210 for electrical grounding purpose. Additionally, the semiconductor power device 200 includes the set of wirebonds 280 electrically connecting the drain electrode (D) of the semiconductor power die 220 to the top metallization layer of the thermal substrate 290, and another set of wirebonds 282 electrically connecting the top metallization layer of the thermal substrate 290 to the output lead 250.

The ring frame 230 may include a thin metallization layer 232 along its bottom for attachment to the base plate 210. Similarly, the ring frame 230 may include another thin metallization layer 234 along its input-side top region for attachment to the input lead 240. Further, the ring frame 230 may include yet another thin metallization layer 236 along its output-side top region for attachment to the output lead 250.

In this configuration, the effective thermal impedance $R_{eff}$ between the top surface or active region of the semiconductor power die 220 and the base plate 210 is a parallel combination of the thermal impedance $R_{SiC}$ of the substrate (e.g., SiC) of the semiconductor power die 220, the thermal impedance $R_{TH1}$ of the ring frame 230, and the thermal impedance $R_{TH2}$ of the thermal substrate 290. As such, the effective parallel impedance $R_{eff}$ between the top surface or active region of the semiconductor power die 220 and the base plate 210 may be approximated by the following relationship:

$$\frac{1}{R_{eff}} = \frac{1}{R_{SiC}} + \frac{1}{R_{TH1}} + \frac{1}{R_{TH2}} \qquad \text{Eq. 2a}$$

If the thermal impedance $R_{SiC}$ of the semiconductor power die 220 is large compared to the respective thermal impedances $R_{TH1}$ and $R_{TH2}$, the relationship for the effective thermal impedance $R_{eff}$ may be approximated per the following equation:

$$R_{eff} = \frac{R_{TH1} \cdot R_{TH2}}{R_{TH1} + R_{TH2}} \text{ If } R_{TH1} \text{ and } R_{TH2} \ll R_{SiC} \qquad \text{Eq. 2b}$$

Because of this paralleling effect, the effective thermal impedance $R_{eff}$ may be substantially reduced to decrease the junction temperature of the semiconductor power die 220. This allows the semiconductor power die 220 to be operated at higher power configurations while maintaining the maximum junction temperature within a safe and reliable temperature range.

Figure 3A:
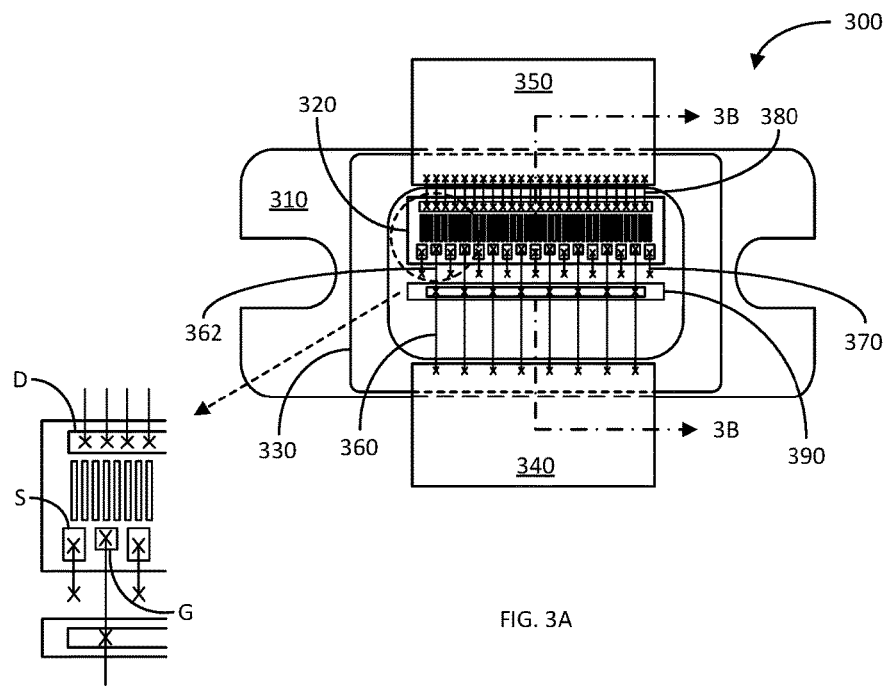
FIGS. 3A-3B illustrate top and cross-sectional views of another exemplary semiconductor power device in accordance with another aspect of the disclosure.

FIG. 3A illustrates a top view of another exemplary semiconductor power device 300 in accordance with another aspect of the disclosure. In summary, the semiconductor power device 300 is similar to that of semiconductor power device 200 but instead of including a thermal substrate thermally and electrically coupled to the drain electrode (D) of the semiconductor power die 220, the semiconductor power device 300 includes a thermal substrate thermally and electrically coupled to a set of gate electrodes (G) of a semiconductor power die. Thus, the ring frame provides drain-side thermal management, and the thermal substrate provides gate-source side thermal management. To effectuate this electrical and thermal coupling, a set of wirebonds or conductive-ribbons (generally, electrical conductors) electrically attach the set of gate electrodes (G) of the semiconductor power die to a top metallization layer of the thermal substrate.

In particular, the semiconductor power device 300 includes a base plate 310 (e.g., a flange), a power semiconductor die 320 disposed on the base plate 310, a ring frame 330 disposed on the base plate 310 and surrounding the power semiconductor die 320, an input lead 340 disposed on an input-side portion of the ring frame 330, and an output lead 350 disposed on an output-side portion of the ring frame 330. Again, in this example, the semiconductor power die 320 is configured as a GaN on SiC HEMT, but may be configured as another type of semiconductor device. As illustrated in the accompanying blow up view, the semiconductor power die 320 includes a set of gate electrodes (G), a set of source electrodes (S), and a drain electrode (D).

The semiconductor power device 300 further includes a thermal substrate 390 disposed on the base plate 310 adjacent to the gate/source-side of the semiconductor power die 320. The thermal substrate 390 includes a top metallization layer, which may be a continuous metallization pad as illustrated or a set of metallization pads (such as one pad for each wirebond attachment). For thermal management, the ring frame 330 and the thermal substrate 390 may be comprised of BeO, SiC, diamond, AlN, or other suitable thermally-conductive material. Additionally, the thermal substrate 390 is configured to prevent a short (e.g., mainly electrically-insulating) between the set of gate electrodes (G) of the semiconductor power die 320 and the base plate 310.

The semiconductor power device 300 further includes a set of wirebonds or conductive-ribbons (generally, electrical conductors) 360 electrically coupling the input lead 340 to the top metallization layer of the thermal substrate 390. Additionally, the semiconductor power device 300 includes another set of wirebonds or conductive-ribbons (generally, electrical conductors) 362 electrically coupling the top metallization layer of the thermal substrate 390 to the set of gate electrodes (G) of the semiconductor power die 320. In this configuration, the semiconductor power die 320 receives an input signal from the input lead 340 via the sets of electrical conductors 360 and 362.

It shall be understood that there may be other components (e.g., resistor, capacitor, and/or inductor) coupled between the input lead 340 and the metallization layer of the thermal substrate 390, between the input lead 340 and the base plate 310, between the metallization layer of the thermal substrate 390 and the base plate 310, between the metallization layer of the thermal substrate 390 and the set of gate electrodes (G) of the semiconductor die 320, and/or between the set of gate electrodes (G) and the base plate 310. Such components may be used to configure the semiconductor power device 300 with desirable characteristics, such as to improve the impedance match between the input of the semiconductor power device 300 and an input transmission line (not shown) coupled to the input lead 340.

Additionally, the semiconductor power device 300 includes another set of wirebonds or conductive-ribbons (generally electrical conductors) 370 electrically coupling the set of source electrodes (S) of the semiconductor power die 320 to the base plate 310 for electrical grounding purpose.

Also, the semiconductor power device 300 includes yet another set of wirebonds or conductive-ribbons (generally, electrical conductors) 380 electrically coupling the drain electrode (D) of the semiconductor power die 320 to the output lead 350. The semiconductor power die 320 produces an output signal (based on the input signal (e.g., by amplifying the input signal)) at the output lead 350 via the set of electrical conductors 380. Similarly, it shall be understood that there may be other components (e.g., resistor, capacitor, and/or inductor) coupled between the drain electrode (D) of the semiconductor die 320 and the output lead 350, between the drain electrode (D) and the base plate 310, and/or between the base plate 310 and the output lead 350. Such components may be used to configure the semiconductor power device 300 with desirable characteristics, such as to improve the impedance match between the output of the semiconductor power device 300 and an output transmission line (not shown) coupled to the output lead 350.

To reduce the thermal impedance between the top surface or active region of the semiconductor power die 320 and the base plate 310 at effectively thermal ground, the thickness and type of metallization layer of the thermal substrate 390 should be selected to improve the thermal heat transfer. For example, the metallization layer may be comprised of copper. Additionally, the number of wirebonds 362 electrically coupling the set of gate electrodes (G) to the metallization layer of the thermal substrate 390 should be as high as possible considering space restriction so as to maximize the bond cross-sectional area. For example, the minimum spacing between round wirebonds is about 0.004 inch. The number of gold wirebonds is made large as possible to conduct heat from the die to the thermal substrate. There may be multiple wirebonds per pad if the metallization layer of the thermal substrate comprises a plurality of separate metallization pads.

Figure 3B:
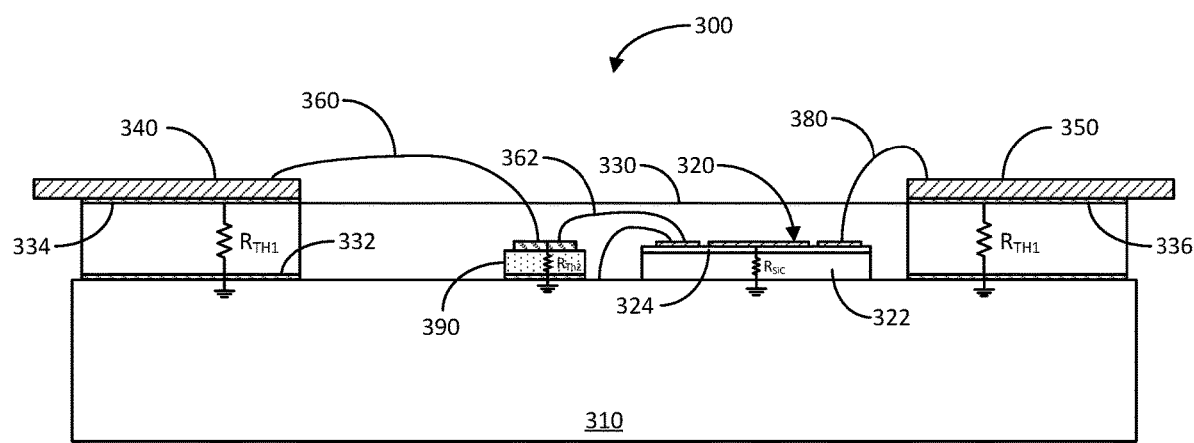

FIG. 3B illustrates a cross-sectional view of the semiconductor power device 300 along line 3B-3B as depicted in FIG. 3A. As illustrated, the semiconductor power device 300 includes the set of wirebonds 360 electrically connecting the input lead 340 to the top metallization layer of the thermal substrate 390. The semiconductor power device 300 also includes the set of wirebonds 362 electrically connecting the top metallization layer of the thermal substrate 390 to the set of gate electrodes (G) of the semiconductor power die 320. The semiconductor power device 300 also includes the set of wirebonds 370 electrically connecting the set of source electrodes (S) of the semiconductor power die 320 to the base plate 310 for electrical grounding purposes. Additionally, the semiconductor power device 300 includes the set of wirebonds 380 electrically connecting the drain electrode (D) of the semiconductor power die 320 to the output lead 350.

Similarly, the ring frame 330 may include a thin metallization layer 332 along its bottom for attachment to the base plate 310. The ring frame 330 may include another thin metallization layer 334 along its input-side top region for attachment to the input lead 340. The ring frame 330 further includes another thin metallization layer 336 along its output-side top region for attachment to the output lead 350.

In this configuration, the effective thermal impedance $R_{eff}$ between the top surface or active region of the semiconductor power die 320 and the base plate 310 is the parallel combination of the thermal impedance $R_{SiC}$ of the substrate (e.g., SiC) of the semiconductor power die 320, the thermal impedance $R_{TH1}$ of the ring frame 330, and the thermal impedance $R_{TH2}$ of the thermal substrate 390. As such, the effective parallel impedance $R_{eff}$ between the top surface or active region of the semiconductor power die 320 and the base plate 310 may be approximated by the following relationship:

$$\frac{1}{R_{eff}} = \frac{1}{R_{SiC}} + \frac{1}{R_{TH1}} + \frac{1}{R_{TH2}} \qquad \text{Eq. 3a}$$

If the thermal resistance $R_{SiC}$ of the semiconductor power die 320 is large compared to the respective thermal impedances $R_{TH1}$ and $R_{TH2}$, the relationship for the effective thermal impedance $R_{eff}$ may be approximated per the following equation:

$$R_{eff} = \frac{R_{TH1} \cdot R_{TH2}}{R_{TH1} + R_{TH2}} \text{ If } R_{TH1} \text{ and } R_{TH2} \ll R_{SiC} \qquad \text{Eq. 3b}$$

Because of this paralleling effect, the effective thermal impedance $R_{eff}$ may be substantially reduced to decrease the junction temperature of the semiconductor power die 320. This allows the semiconductor power die 320 to be operated at higher power configurations while maintaining the maximum junction temperature within a safe and reliable temperature range.

Figure 4A:
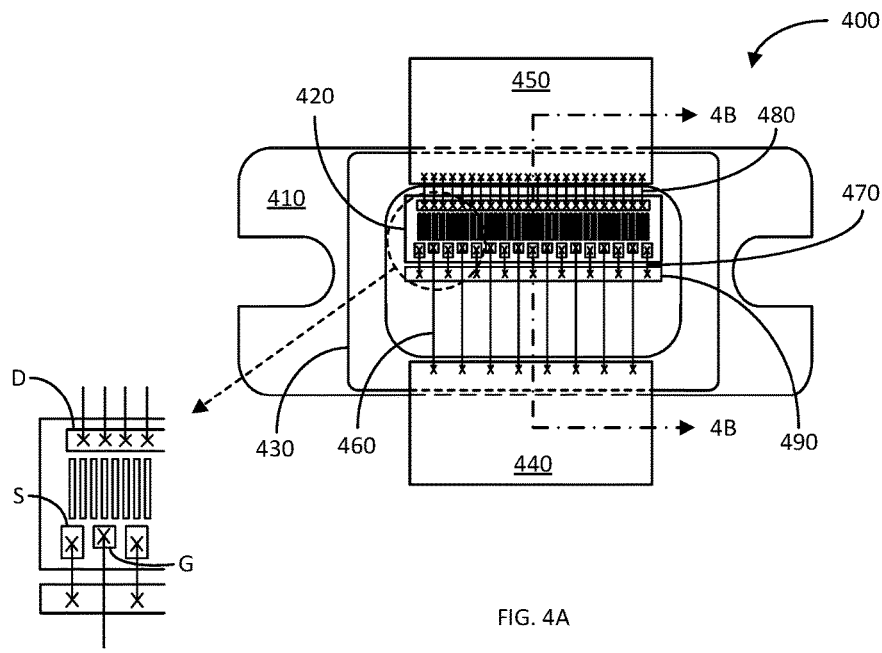
FIGS. 4A-4B illustrate top and cross-sectional views of another exemplary semiconductor power device in accordance with another aspect of the disclosure.

FIG. 4A illustrates a top view of another exemplary semiconductor power device 400 in accordance with another aspect of the disclosure. In summary, the semiconductor power device 400 is similar to that of semiconductor power device 300, but instead of including a thermal substrate thermally and electrically coupled to the set of gate electrodes (G) of the semiconductor power die 320, the semiconductor power device 400 includes a metal bar disposed on the base plate and electrically coupled to a set of source electrodes (S) of a semiconductor power die. Thus, the ring frame provides drain-side thermal management, and the metal bar provides gate-source side thermal management. To effectuate this electrical and thermal coupling, a set of wirebonds or conductive-ribbons (generally electrical conductors) electrically attach the set of source electrodes (S) of the semiconductor power die to the metal bar.

In particular, the semiconductor power device 400 includes a base plate 410 (e.g., a flange), a semiconductor power die 420 disposed on the base plate 410, a ring frame 430 disposed on the base plate 410 and surrounding the power semiconductor die 420, an input lead 440 disposed on an input-side portion of the ring frame 430, and an output lead 450 disposed on an output-side portion of the ring frame 430. Again, in this example, the semiconductor power die 420 is configured as a GaN on SiC HEMT, but may be configured as another type of semiconductor device. As illustrated in the accompanying blow up view, the semiconductor power die 420 includes a set of gate electrodes (G), a set of source electrodes (S), and a drain electrode (D). The semiconductor power device 400 further includes a metal bar 490 disposed on the base plate 410 adjacent to the gate/source-side of the semiconductor power die 420.

The semiconductor power device 400 further includes a set of wirebonds or conductive-ribbons (generally, electrical conductors) 460 electrically coupling the input lead 440 to the set of gate electrodes (G) of the semiconductor power die 420, respectively. The semiconductor power die 420 receives an input signal from the input lead 440 via the set of electrical conductors 460. It shall be understood that there may be other components (e.g., resistor, capacitor, and/or inductor) coupled between the input lead 440 and the set of gate electrodes (G) of the semiconductor die 420, between the input lead 440 and the base plate 410, and/or between the set of gate electrodes (G) and the base plate 410. Such components may be used to configure the semiconductor power device 400 with desirable characteristics, such as to improve the impedance match between the input of the semiconductor power device 400 and an input transmission line (not shown) coupled to the input lead 440.

Additionally, the semiconductor power device 400 includes another set of wirebonds or conductive-ribbons (generally, electrical conductors) 470 electrically coupling the set of source electrodes (S) of the semiconductor power die 420 to the metal bar 490. As discussed, the set of source electrodes (S) of the semiconductor power die 420 are electrically coupled to the base plate 410 via the metal bar 490 for electrical grounding purpose. The metal bar 490 allows for shorter wirebonds 470 to reduce the thermal impedance between the active region of the semiconductor power die 420 and the base plate 410 at substantially thermal ground.

Also, the semiconductor power device 400 includes yet another set of wirebonds or conductive-ribbons (generally, electrical conductors) 480 electrically coupling the drain electrode (D) of the semiconductor power die 420 to the output lead 450. The semiconductor power die 420 produces an output signal (based on the input signal (e.g., by amplifying the input signal)) at the output lead 450 via the set of electrical conductors 480.

It shall be understood that there may be other components (e.g., resistor, capacitor, and/or inductor) coupled between the drain electrode (D) of the semiconductor die 420 and the output lead 450, between the drain electrode (D) and the base plate 410, and/or between the base plate 410 and the output lead 450. Such components may be used to configure the semiconductor power device 400 with desirable characteristics, such as to improve the impedance match between the output of the semiconductor power device 400 and an output transmission line (not shown) coupled to the output lead 450.

To reduce the thermal impedance between the top surface or active region of the semiconductor power die 420 and the base plate 410 at effectively thermal ground, the thickness and material used for the metal bar 490 should be selected to improve the thermal heat transfer. For example, the metal bar 490 may be comprised of copper, silver or gold, but for economic reasons, copper is typically preferred. Additionally, the number of wirebonds 470 from the set of source electrodes (S) to the metal bar 490 should be as high as possible considering space restriction so as to maximize the bond cross-sectional area. For example, the minimum spacing between round wirebonds is about 0.004 inch. The number of gold wirebonds is made large as possible to conduct heat from the die to the thermal substrate.

Figure 4B:
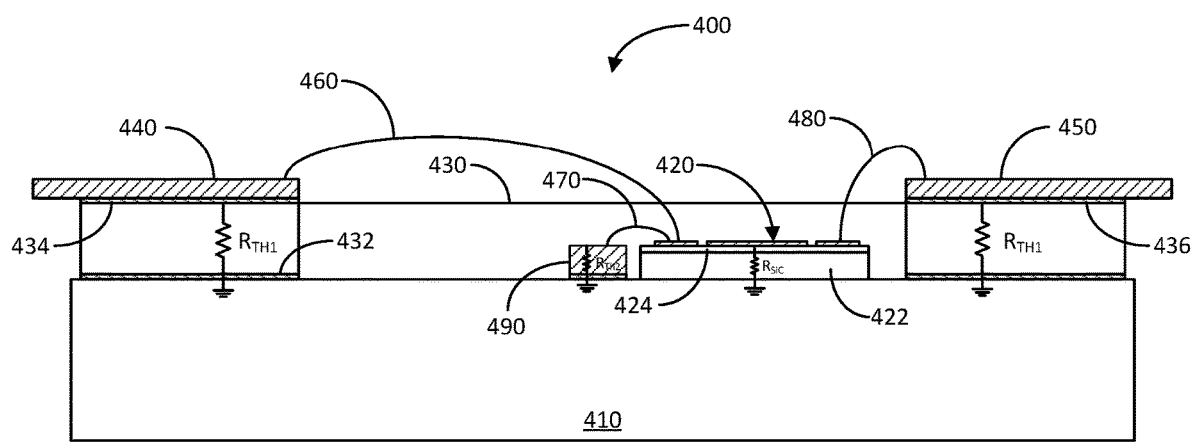

FIG. 4B illustrates a cross-sectional view of the semiconductor power device 400 along line 4B-4B as depicted in FIG. 4A. As illustrated, the semiconductor power device 400 includes the set of wirebonds 460 electrically connecting the input lead 440 to the set of gate electrodes (G) of the semiconductor power die 420. The semiconductor power device 400 also includes the set of wirebonds 470 electrically connecting the source electrode (S) of the semiconductor power die 420 to the metal bar 490. Additionally, the semiconductor power device 400 includes the set of wirebonds 480 electrically connecting the drain electrode (D) of the semiconductor power die 420 to the output lead 450.

The ring frame 430 may include a thin metallization layer 432 along its bottom for attachment to the base plate 410. The ring frame 430 may include another thin metallization layer 434 along its input-side top region for attachment to the input lead 440. The ring frame 430 further includes another thin metallization layer 436 along its output-side top region for attachment to the output lead 450.

In this configuration, the effective thermal impedance $R_{eff}$ between the top surface or active region of the semiconductor power die 420 and the base plate 410 is a parallel combination of the thermal impedance $R_{SiC}$ of the substrate (e.g., SiC) of the semiconductor power die 420, the thermal impedance $R_{TH1}$ of the ring frame 430, and the thermal impedance $R_{TH2}$ of the metal bar 490. As such, the effective parallel impedance $R_{eff}$ between the top surface or active region of the semiconductor power die 420 and the base plate 410 may be approximated by the following relationship:

$$\frac{1}{R_{eff}} = \frac{1}{R_{SiC}} + \frac{1}{R_{TH1}} + \frac{1}{R_{TH2}} \qquad \text{Eq. 4a}$$

If the thermal resistance $R_{SiC}$ of the semiconductor power die 420 is large compared to the respective thermal impedances $R_{TH1}$ and $R_{TH2}$, the relationship for the effective thermal impedance $R_{eff}$ may be approximated per the following equation:

$$R_{eff} = \frac{R_{TH1} \cdot R_{TH2}}{R_{TH1} + R_{TH2}} \text{ If } R_{TH1} \text{ and } R_{TH2} \ll R_{SiC} \qquad \text{Eq. 4b}$$

Because of this paralleling effect, the effective thermal impedance $R_{eff}$ may be substantially reduced to decrease the junction temperature of the semiconductor power die 420. This allows the semiconductor power die 420 to be operated at higher power configurations while maintaining the maximum junction temperature within a safe temperature range.

Figure 5A:
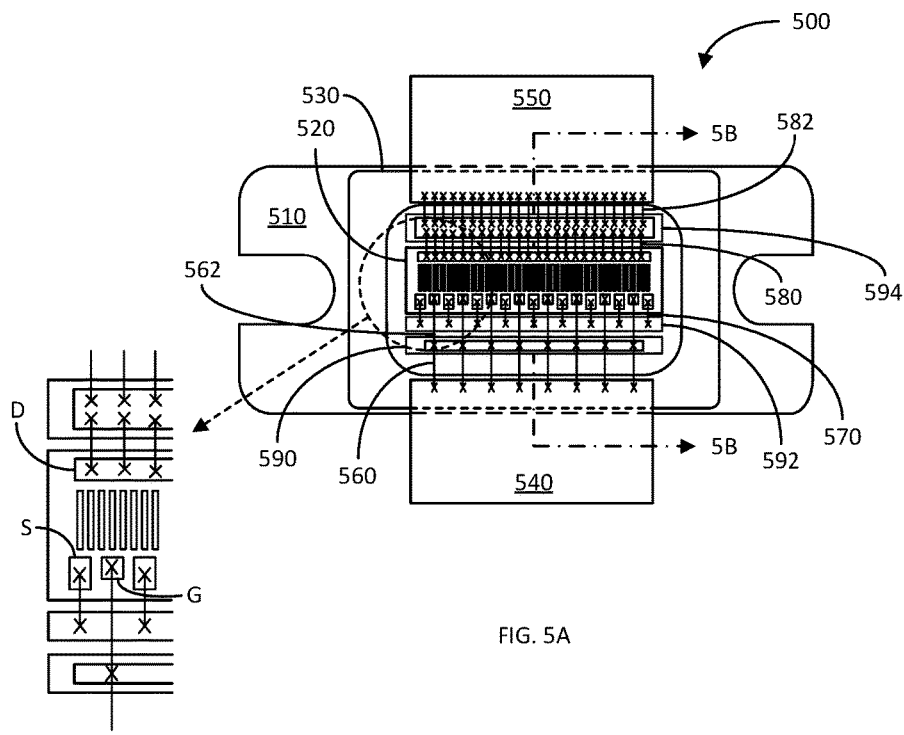
FIGS. 5A-5B illustrate top and cross-sectional views of another exemplary semiconductor power device in accordance with another aspect of the disclosure.

FIG. 5A illustrates a top view of another exemplary semiconductor power device 500 in accordance with another aspect of the disclosure. In semiconductor power device 200, the thermal substrate 290 was coupled to the drain electrode (D) of the semiconductor power die 220. In semiconductor power device 300, the thermal substrate 390 was coupled to the set of gate electrodes (G) of the semiconductor power die 320. And, in semiconductor power device 400, the metal bar 490 was coupled to the set of source electrodes (S) of the semiconductor power die 420.

It shall be understood that, in addition to the ring frame, one or more thermal substrates or other thermally-conductive structures may be used to thermally couple to any combination of the gate electrodes (G), source electrodes (S) and drain electrode (D) of a semiconductor power die. As an example of this, the semiconductor power device 500 includes a first thermal substrate electrically and thermally coupled to the gate electrodes (G), a metal bar electrically and thermally coupled to the source electrodes (S), and a second thermal substrate electrically and thermally coupled to the drain electrode (D).

More specifically, the semiconductor power device 500 includes a base plate 510 (e.g., a flange), a semiconductor power die 520 disposed on the base plate 510, a ring frame 530 disposed on the base plate 510 and surrounding the power semiconductor die 520, an input lead 540 disposed on an input-side portion of the ring frame 530, and an output lead 550 disposed on an output-side portion of the ring frame 530. Again, in this example, the semiconductor power die 520 is configured as a GaN on SiC HEMT, but may be configured as another type of semiconductor device. As illustrated in the accompanying blow up view, the semiconductor power die 520 includes a set of gate electrodes (G), a set of source electrodes (S), and a drain electrode (D).

The semiconductor power device 500 further includes a first thermal substrate 590 disposed on the base plate 510 between the input lead 540 and the gate/source-side of the semiconductor power die 520. The first thermal substrate 590 includes a top metallization layer electrically and thermally coupled to the set of gate electrodes (G) and the input lead 540. The first thermal substrate 590 may be comprised of BeO, SiC, diamond, AlN, or other suitable thermally-conductive material.

The semiconductor power device 500 further includes a metal bar 592 disposed on the base plate 510 between the first thermal substrate 590 and the semiconductor power die 520. The metal bar 592 is electrically and thermally coupled to the set of source electrodes (S). Accordingly, the metal bar 592 electrically couples the source electrodes (S) to the base plate 510 for electrical grounding purpose.

The semiconductor power device 500 further includes a second thermal substrate 594 disposed on the base plate 510 between the semiconductor power die 520 and the output lead 550. The second thermal substrate 594 includes a top metallization layer electrically and thermally coupled to the drain electrode (D) of the semiconductor power die 520 and to the output lead 550. The second thermal substrate 594 may be comprised of BeO, SiC, diamond, AlN, or other suitable thermally-conductive material.

The semiconductor power device 500 further includes a set of wirebonds or conductive-ribbons (generally, electrical conductors) 560 electrically coupling the input lead 540 to the top metallization layer of the first thermal substrate 590. The semiconductor power device 500 also includes a set of wirebonds or conductive-ribbons (generally, electrical conductors) 562 electrically coupling the top metallization layer of the first thermal substrate 590 to the set of gate electrodes (G), respectively. In this configuration, the semiconductor power die 520 receives an input signal from the input lead 540 via the sets of electrical conductors 560 and 562.

It shall be understood that there may be other components (e.g., resistor, capacitor, and/or inductor) coupled between the input lead 540 and the set of gate electrodes (G) of the semiconductor die 520, between the input lead 540 and the base plate 510, and/or between the set of gate electrodes (G) and the base plate 510. Such components may be used to configure the semiconductor power device 500 with desirable characteristics, such as to improve the impedance match between the input of the semiconductor power device 500 and an input transmission line (not shown) coupled to the input lead 540.

Additionally, the semiconductor power device 500 includes another set of wirebonds or conductive-ribbons (generally electrical conductors) 570 electrically coupling the set of source electrodes (S) of the semiconductor power die 520 to the metal bar 592. As discussed, the set of source electrodes (S) of the semiconductor power die 520 are electrically coupled to the base plate 510 via the metal bar 592 for electrical grounding purpose.

Also, the semiconductor power device 500 includes a set of wirebonds or conductive-ribbons (generally, electrical conductors) 580 electrically coupling the drain electrode (D) of the semiconductor power die 520 to the top metallization layer of the second thermal substrate 594, and another set of wirebonds or conductive-ribbons (generally, electrical conductors) 582 electrically coupling the top metallization layer of the second thermal substrate and the output lead 550. The semiconductor power die 520 produces an output signal (based on the input signal (e.g., by amplifying the input signal)) at the output lead 550 via the set of electrical conductors 580 and 582.

It shall be understood that there may be other components (e.g., resistor, capacitor, and/or inductor) coupled between the drain electrode (D) of the semiconductor die 520 and the output lead 550, between the drain electrode (D) and the base plate 510, and/or between the base plate 510 and the output lead 550. Such components may be used to configure the semiconductor power device 500 with desirable characteristics, such as to improve the impedance match between the output of the semiconductor power device 500 and an output transmission line (not shown) coupled to the output lead 550.

Figure 5B:
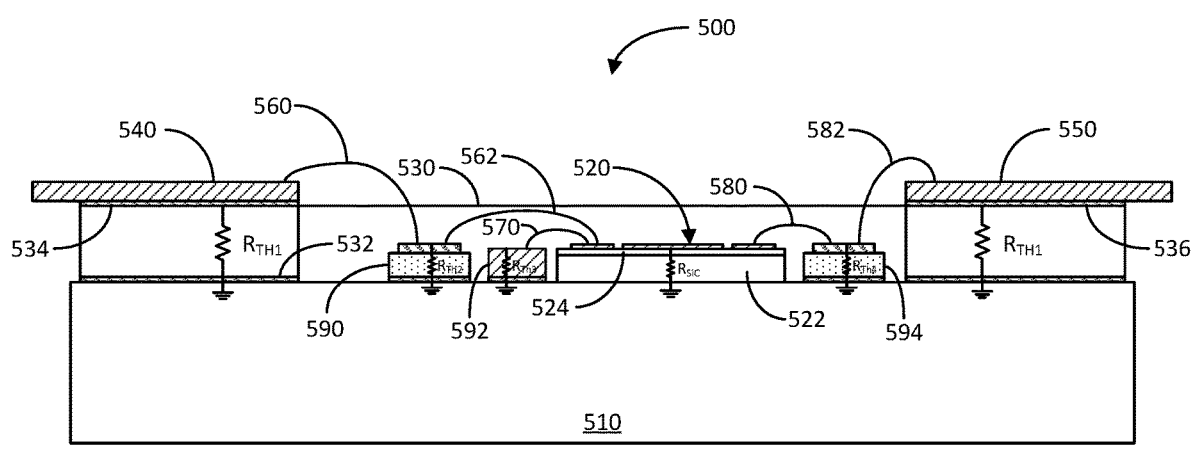

FIG. 5B illustrates a cross-sectional view of the semiconductor power device 500 along line 5B-5B as depicted in FIG. 5A. As illustrated, the semiconductor power device 500 includes the set of wirebonds 560 electrically connecting the input lead 540 to the top metallization layer of the first thermal substrate 590. The semiconductor power device 500 also includes the set of wirebonds 562 electrically connecting the top metallization layer of the first thermal substrate 590 to the set of gate electrodes (G) of the semiconductor power die 520, respectively.

The semiconductor power device 500 also includes the set of wirebonds 570 electrically connecting the set of source electrode (S) of the semiconductor power die 520 to the metal bar 592 for electrical grounding to the base plate 510. Additionally, the semiconductor power device 500 includes the set of wirebonds 580 electrically connecting the drain electrode (D) of the semiconductor power die 520 to the top metallization layer of the second thermal substrate 594. The semiconductor power die 520 also includes the set of wirebonds 582 electrically connecting the top metallization layer of the second thermal substrate 594 to the output lead 550.

The ring frame 530 may include a thin metallization layer 532 along its bottom for attachment to the base plate 510. The ring frame 530 may include another thin metallization layer 534 along its input-side top region for attachment to the input lead 540. The ring frame 530 further includes another thin metallization layer 536 along its output-side top region for attachment to the output lead 550.

In this configuration, the effective thermal impedance $R_{eff}$ between the top surface or active region of the semiconductor power die 520 and the base plate 510 is a weighted parallel combination of the thermal impedance $R_{SiC}$ of the substrate (e.g., SiC) of the semiconductor power die 520, the thermal impedance $R_{TH1}$ of the ring frame 530, the thermal impedance $R_{Th2}$ of the first thermal substrate 590, the thermal impedance $R_{Th3}$ of the metal bar 592, and the thermal impedance $R_{TH4}$ of the second thermal substrate 594. As such, the effective parallel impedance $R_{eff}$ between the top surface or active region of the semiconductor power die 520 and the base plate 510 may be approximated by the following relationship:

$$\frac{1}{R_{eff}} = \frac{1}{R_{SiC}} + \frac{1}{R_{TH1}} + \frac{1}{R_{TH2}} + \frac{1}{R_{TH3}} + \frac{1}{R_{TH4}} \qquad \text{Eq. 5}$$

If the thermal resistance $R_{SiC}$ of the semiconductor power die 520 is large compared to the respective thermal impedances $R_{TT1}$ to $R_{TH4}$, the $1/R_{SiC}$ factor in Eq. 5 may be eliminated.

Because of this paralleling effect, the effective thermal impedance $R_{eff}$ may be substantially reduced to decrease the junction temperature of the semiconductor power die 520. This allows the semiconductor power die 320 to be operated at higher power configurations while maintaining the maximum junction temperature within a safe temperature range.

In the previous embodiments, the ring frame is configured as a complete ring. However, it shall be understood that the ring frame may be a partial ring, with at least one spacing separating one portion from another portion. In general, the ring frame may be at least one frame including a first portion for supporting an input lead and a second portion supporting an output lead.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor power device, comprising:
   a base plate;
   a ring frame disposed on the base plate;
   an input lead disposed on the ring frame;
   an output lead disposed on the ring frame;
   a semiconductor power die disposed on the base plate and surrounded by the ring frame, wherein the semiconductor power die is configured to receive an input signal from the input lead and generate an output signal at the output lead; and
   a thermal substrate disposed on the base plate, wherein the thermal substrate is thermally and electrically coupled to a set of one or more electrodes on the semiconductor power die to reduce a temperature of an active region of the semiconductor power die, wherein the thermal substrate comprises beryllium oxide (BeO), a silicon carbide (SiC), diamond, or aluminum nitride (AlN).

2. The semiconductor power device of claim 1, wherein the ring frame comprises an electrically-insulating material.

3. The semiconductor power device of claim 1, wherein the ring frame comprises beryllium oxide (BeO), a silicon carbide (SiC), diamond, or aluminum nitride (AlN).

4. The semiconductor power device of claim 1, wherein the semiconductor power die comprises a field effect transistor (FET).

5. The semiconductor power device of claim 4, further comprising:
   a first set of one or more electrical conductors electrically coupling the input lead to one or more gate electrodes of the FET;
   a second set of one or more electrical conductors electrically coupling one or more source electrodes of the FET to the base plate; and
   a third set of one or more electrical conductors electrically coupling one or more drain electrodes of the FET to the output lead.

6. The semiconductor power device of claim 5, wherein at least one of the first, second, or third set of one or more electrical conductors comprise at least one wirebond or conductive-ribbon.

7. The semiconductor power device of claim 1, wherein the semiconductor power die comprises:
   a silicon carbide (SiC) substrate disposed on the base plate; and
   a gallium nitride (GaN) layer disposed on the SiC substrate.

8. The semiconductor power device of claim 1, wherein the thermal substrate comprises a top metallization layer, and further comprising a first set of one of more electrical conductors electrically coupling the set of one or more electrodes to the top metallization layer of the thermal substrate.

9. The semiconductor power device of claim 1, further comprising a metal bar disposed on the base plate, wherein the metal bar is thermally and electrically coupled to another set of one or more electrodes on the semiconductor power die to reduce the temperature of the active region of the semiconductor power die.

10. The semiconductor power device of claim 9, wherein the semiconductor power die comprises a field effect transistor (FET), and wherein the another set of one or more electrodes comprises a set of one or more source electrodes of the FET, respectively.

11. A semiconductor power device, comprising:
    a base plate;
    a ring frame disposed on the base plate;
    an input lead disposed on the ring frame;
    an output lead disposed on the ring frame;
    a semiconductor power die disposed on the base plate and surrounded by the ring frame, wherein the semiconductor power die is configured to receive an input signal from the input lead and generate an output signal at the output lead;
    a thermal substrate disposed on the base plate, wherein the thermal substrate is thermally and electrically coupled to a set of one or more electrodes on the semiconductor power die to reduce a temperature of an active region of the semiconductor power die, wherein the thermal substrate comprises a top metallization layer;
    a first set of one of more electrical conductors electrically coupling the set of one or more electrodes to the top metallization layer of the thermal substrate; and
    a second set of one or more electrical conductors electrically coupling the top metallization layer of the thermal substrate to the output lead.

12. The semiconductor power device of claim 11, wherein the semiconductor power device comprises a field effect transistor (FET), and wherein the set of one or more electrodes comprises a set of one or more drain electrodes, respectively.

13. The semiconductor power device of claim 11, wherein the thermal substrate comprises beryllium oxide (BeO), a silicon carbide (SiC), diamond, or aluminum nitride (AlN).

14. A semiconductor power device, comprising:
a base plate;
a ring frame disposed on the base plate;
an input lead disposed on the ring frame;
an output lead disposed on the ring frame;
a semiconductor power die disposed on the base plate and surrounded by the ring frame, wherein the semiconductor power die is configured to receive an input signal from the input lead and generate an output signal at the output lead;
a thermal substrate disposed on the base plate, wherein the thermal substrate is thermally and electrically coupled to a set of one or more electrodes on the semiconductor power die to reduce a temperature of an active region of the semiconductor power die, wherein the thermal substrate comprises a top metallization layer;
a first set of one of more electrical conductors electrically coupling the set of one or more electrodes to the top metallization layer of the thermal substrate; and
a second set of one or more electrical conductors electrically coupling the top metallization layer of the thermal substrate to the input lead.

15. The semiconductor power device of claim 14, wherein the semiconductor power device comprises a field effect transistor (FET), and wherein the set of one or more electrodes comprises a set of one or more gate electrodes, respectively.

16. The semiconductor power device of claim 14, wherein the thermal substrate comprises beryllium oxide (BeO), a silicon carbide (SiC), diamond, or aluminum nitride (AlN).

17. A semiconductor power device, comprising:
a base plate;
at least one frame disposed over the base plate;
an input lead disposed over the at least one frame;
an output lead disposed over the at least one frame;
a semiconductor power die disposed over the base plate, wherein the semiconductor power die is configured to receive an input signal from the input lead and generate an output signal at the output lead; and
a thermal substrate disposed over the base plate, wherein the thermal substrate is thermally and electrically coupled to a set of one or more electrodes on the semiconductor power die to reduce a temperature of an active region of the semiconductor power die, wherein the thermal substrate comprises beryllium oxide (BeO), a silicon carbide (SiC), diamond, or aluminum nitride (AlN).

18. The semiconductor power device of claim 17, wherein the at least one frame comprises beryllium oxide (BeO), a silicon carbide (SiC), diamond, or aluminum nitride (AlN).

19. The semiconductor power device of claim 17, wherein the semiconductor power device comprises a field effect transistor (FET) including at least one gate electrode electrically coupled to the input lead, at least one source electrode electrically coupled to the base plate, and at least one drain electrode electrically coupled to the output lead.

20. A gallium-nitride (GaN) on silicon carbide (SiC) high electron mobility transistor (HEMT), comprising:
a base plate;
at least one frame disposed over the base plate;
an input lead disposed over the at least one frame;
an output lead disposed over the at least one frame;
a semiconductor power die disposed over the base plate, wherein the semiconductor power die includes a set of one or more gate electrodes configured to receive an input signal by way of the input lead, a set of one or more source electrodes electrically coupled to the base plate, and a set of one or more drain electrodes configured to produce an output signal at the output lead;
a first set of one or more electrical conductors by way the set of one or more gate electrodes receive the input signal from the input lead;
a second set of one or more electrical conductors electrically connecting the set of one or more source electrodes to the base plate; and
a third set of one or more electrical conductors by way the set of one or more drain electrodes produce the output signal at the output lead; and
a thermal substrate disposed over the base plate, wherein the thermal substrate is thermally and electrically coupled to the set of one or more gate or drain electrodes on the semiconductor power die to reduce a temperature of an active region of the semiconductor power die, wherein the thermal substrate comprises beryllium oxide (BeO), a silicon carbide (SiC), diamond, or aluminum nitride (AlN).

* * * * *